(12) United States Patent
Kikukawa et al.

(10) Patent No.: US 10,739,998 B2
(45) Date of Patent: Aug. 11, 2020

(54) MEMORY SYSTEM

(71) Applicant: TOSHIBA MEMORY CORPORATION, Minato-ku, Tokyo (JP)

(72) Inventors: Shingo Kikukawa, Yokohama Kanagawa (JP); Satoshi Kaburaki, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 99 days.

(21) Appl. No.: 15/910,326

(22) Filed: Mar. 2, 2018

(65) Prior Publication Data

US 2019/0087097 A1    Mar. 21, 2019

(30) Foreign Application Priority Data

Sep. 20, 2017  (JP) ................................ 2017-180311

(51) Int. Cl.
| | | |
|---|---|---|
| *G06F 12/00* | (2006.01) | |
| *G06F 3/06* | (2006.01) | |
| *G06F 12/1009* | (2016.01) | |
| *G06F 12/02* | (2006.01) | |
| *G11C 16/04* | (2006.01) | |
| *G11C 16/10* | (2006.01) | |
| *G11C 7/10* | (2006.01) | |

(52) U.S. Cl.
CPC ............ *G06F 3/0608* (2013.01); *G06F 3/064* (2013.01); *G06F 3/0658* (2013.01); *G06F 3/0661* (2013.01); *G06F 3/0679* (2013.01); *G06F 12/0246* (2013.01); *G06F 12/1009* (2013.01); *G06F 2212/1044* (2013.01); *G06F 2212/2022* (2013.01); *G06F 2212/401* (2013.01); *G06F 2212/7202* (2013.01); *G11C 7/1006* (2013.01); *G11C 16/0483* (2013.01); *G11C 16/10* (2013.01)

(58) Field of Classification Search
CPC ...... G06F 3/0608; G06F 3/064; G06F 3/0658; G06F 3/0661
See application file for complete search history.

(56) References Cited

U.S. PATENT DOCUMENTS

| | | | |
|---|---|---|---|
| 6,611,919 B1 | 8/2003 | Matsuya et al. | |
| 2009/0150641 A1* | 6/2009 | Flynn ..................... | G06F 3/061 711/202 |
| 2016/0054938 A1 | 2/2016 | Owa et al. | |
| 2017/0024278 A1* | 1/2017 | Twitto ................. | G06F 11/1068 |

FOREIGN PATENT DOCUMENTS

| | | |
|---|---|---|
| JP | 2008-176420 A | 7/2008 |
| JP | 2011-113293 A | 6/2011 |

* cited by examiner

*Primary Examiner* — Gurtej Bansal
(74) *Attorney, Agent, or Firm* — Foley & Lardner LLP (57) ABSTRACT

According to one embodiment, a memory system includes a nonvolatile memory and a controller configured to control the nonvolatile memory using first data. The controller is configured to write either the first data or second data into the nonvolatile memory based on a total write amount of user data into the nonvolatile memory. The second data is compressed data of the first data.

11 Claims, 7 Drawing Sheets

MEMORY SYSTEM

CROSS-REFERENCE TO RELATED APPLICATION

This application claims the benefit of and priority to Japanese Patent Application No. 2017-180311, filed Sep. 20, 2017, the entire contents of which are incorporated herein by reference.

FIELD

Embodiments described herein generally relate to a memory system.

BACKGROUND

As a memory system, a solid state drive (SSD) on which a nonvolatile semiconductor memory such as a NAND flash memory is mounted is known. For example, an SSD is used as an external storage device for various computers. In the SSD, a system data nonvolatilization in which system data for managing the SSD is written into a NAND flash memory per predetermined period of time is execute to store the system data.

DETAILED DESCRIPTION

Exemplary embodiments provide a memory system capable of reducing write time.

In general, according to some embodiments, a memory system may include a nonvolatile memory and a controller configured to control the nonvolatile memory using first data. The controller is configured to write either the first data or second data into the nonvolatile memory based on a total write amount of user data into the nonvolatile memory. The second data may be compressed data of the first data.

Hereinafter, embodiments will be described with reference to the drawings. In the following description, components having the same function and configuration will be represented by the same reference numerals. In addition, each of the embodiments described below shows an example of a device or a method for practicing the technical ideas of the embodiment, and materials, shapes, structures, disposition, and the like of components are not limited to those described below.

Each of functional blocks can be implemented by hardware, computer software, or a combination of hardware and computer software. The functional blocks are not necessarily divided as described in the following examples. For example, some function may be implemented by another functional block different from an exemplary functional block. Further, the exemplary functional block may be further divided into functional sub-blocks. Here, a solid state drive (SSD) implementing a nonvolatile semiconductor memory will be described as an example of the memory system.

A memory system according to a first embodiment will be described.

Configuration of Memory System

Figure 1:
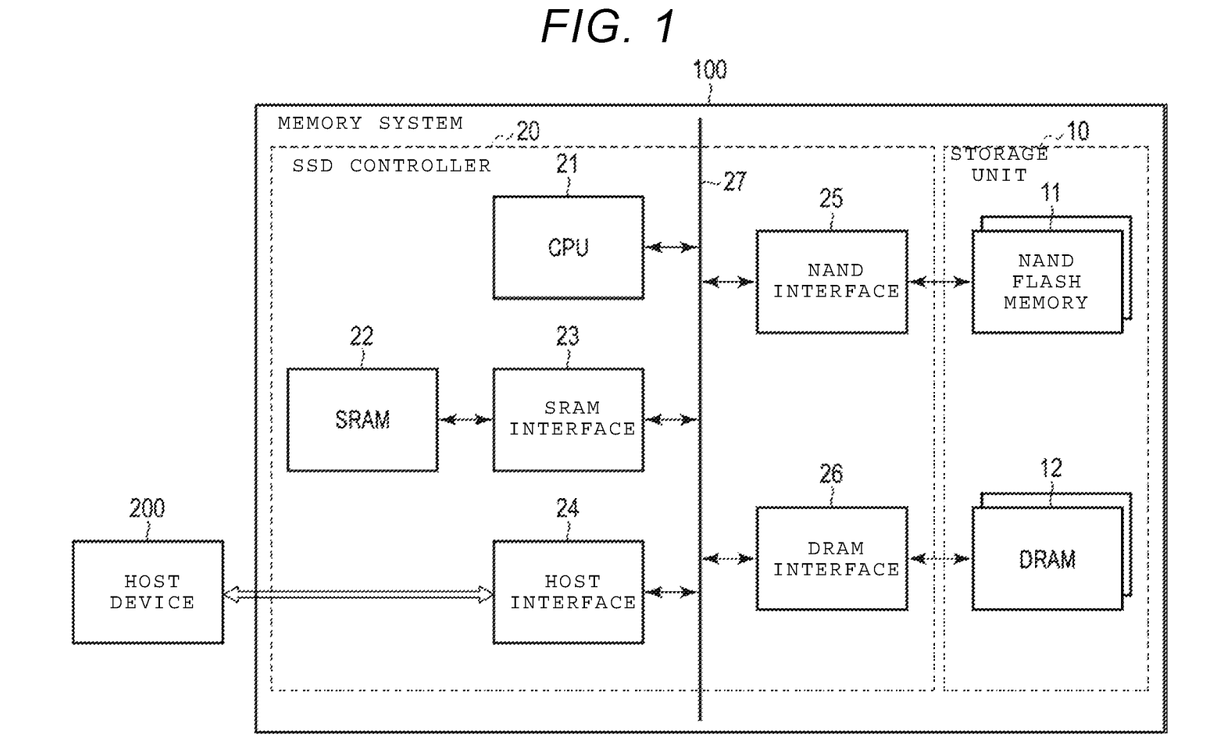
FIG. 1 is a block diagram illustrating a configuration of a memory system according to a first embodiment.

A configuration of the memory system according to the first embodiment will be described with reference to FIG. 1. FIG. 1 is a block diagram illustrating the configuration of the memory system. A memory system (SSD) 100 includes a storage unit 10 and an SSD controller 20.

The storage unit 10 may include semiconductor memories such as a nonvolatile memory and a volatile memory, for example, plural NAND flash memories 11 and dynamic random access memories (DRAMs) 12. Here, the NAND flash memories 11 and the DRAMs 12 will be described as an example, but the kind and number of semiconductor memories are not limited thereto. As the nonvolatile memory, for example, a magnetoresistive random access memory (MRAM) or a ferroelectric random access memory (FeRAM) may also be used. As the volatile memory, for example, a static random access memory (SRAM) may also be used.

The SSD controller 20 controls the storage unit 10. The SSD controller 20 may be configured as an integrated circuit such as a system on a chip (SoC), a field programmable gate array (FPGA), or an application specific integrated circuit (ASIC). The SSD controller 20 includes a central processing unit (CPU) 21, a built-in memory such as an SRAM 22, an SRAM interface 23, a host interface 24, a NAND interface 25, and a DRAM interface 26. The CPU 21, the SRAM 22, the SRAM interface 23, the host interface 24, the NAND interface 25, and the DRAM interface 26 are connected to each other so that signals are communicated therebetween through a bus 27.

The CPU 21 controls the memory system 100. The SRAM 22 is used as a working storage area of the CPU 21. The SRAM interface 23 is communicatively connected to the SRAM 22 and communicates with the SRAM 22. The host interface 24 is communicatively connected to a host device 200 and communicates with the host device 200. The NAND interface 25 is communicatively connected to the NAND flash memory 11 and communicates with the NAND flash memory 11. The DRAM interface 26 is communicatively connected to the DRAM 12 and communicates with the DRAM 12.

Figure 2:
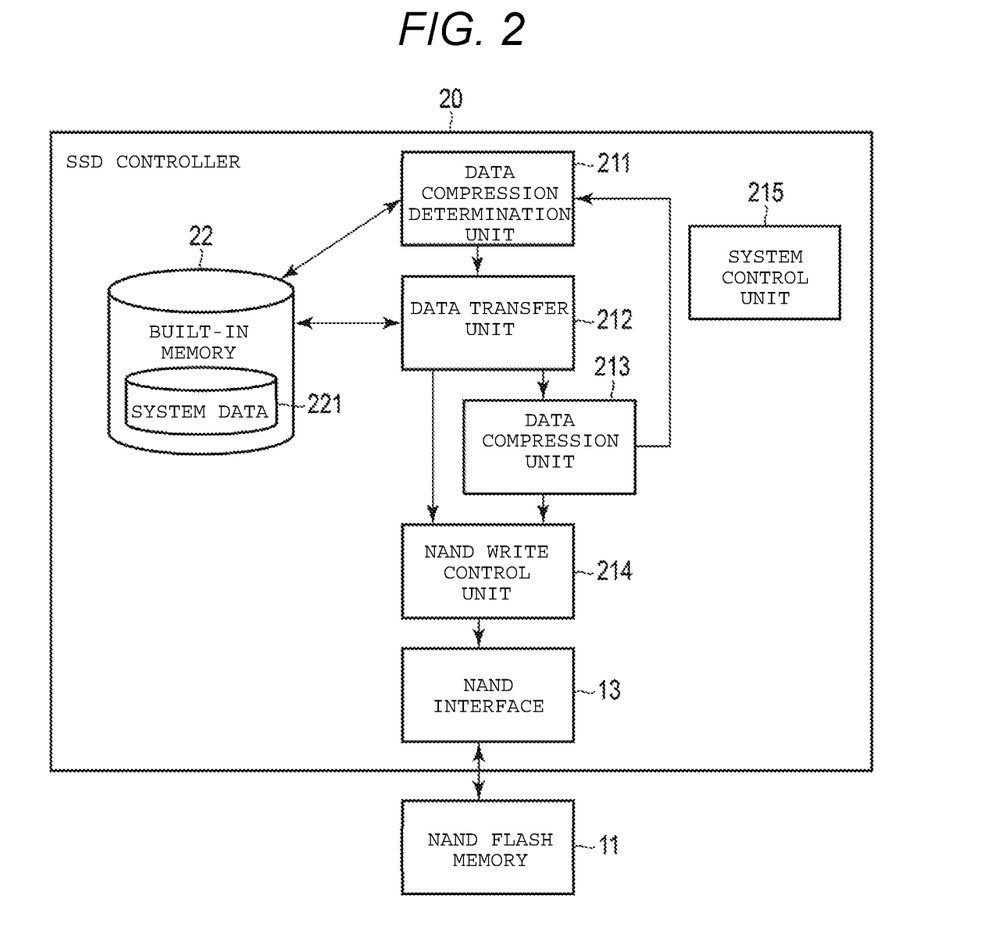
FIG. 2 is a functional block diagram illustrating an SSD controller according to the first embodiment.

Next, functional blocks of the SSD controller 20 of the memory system 100 will be described with reference to FIG. 2. FIG. 2 illustrates functional blocks in the SSD controller 20. The SSD controller 20 includes, shown as the functional blocks, a data compression determination unit 211, a data transfer unit 212, a data compression unit 213, a NAND write control unit 214, and a system control unit 215. Functions of the data compression determination unit 211, the data transfer unit 212, the data compression unit 213, the NAND write control unit 214, and the system control unit 215 may be realized by the CPU 21. These functions may also be realized by dedicated hardware including but not limited to circuits. As described above, the SSD controller 20 includes the SRAM 22 as the built-in memory and the NAND interface 25. The NAND flash memory 11 is connected to the SSD controller 20.

The SRAM 22 stores system data 221 for managing the memory system 100 or managing the NAND flash memory 11 (see FIG. 1). The system data 221 is not user data received from the host device 200, but is data (information) that is updated in response to at least either reading or writing of the user data in the NAND flash memory 11. The system data includes, for example, a logical address-physical address conversion table for associating a logical address and a physical address with each other, that is, for converting a logical address into a physical address.

The data compression determination unit 211 determines whether or not the system data 221 stored in the SRAM 22 is to be compressed. When the system data 221 is determined to be compressed by the data compression determination unit 211, the data transfer unit 212 transfers the system data 221 supplied from the SRAM 22 or the data compression determination unit 211 to the data compression unit 213. On the other hand, when the system data 221 is determined not to be compressed by the data compression determination unit 211, the data transfer unit 212 transfers the system data 221 supplied from the SRAM 22 or from the data compression determination unit 211 to the NAND write control unit 214.

The data compression unit 213 compresses the system data 221 supplied from the data transfer unit 212, and outputs the compressed system data to the NAND write control unit 214 or to the data compression determination unit 211.

The NAND write control unit 214 writes the compressed system data supplied from the data compression unit 213 or the system data supplied from the data transfer unit 212 into the NAND flash memory 11 through the NAND interface 25.

The system control unit 215 (e.g., a controller) controls operations of the functional blocks in the SSD controller 20 (e.g., the functional blocks illustrated in FIG. 2).

Operation of Memory System

In an SSD, a system data nonvolatilization (hereinafter, also referred to as "nonvolatilization") in which system data is written into a NAND flash memory per predetermined period of time or when an instruction is given from the CPU 21 and is executed to store the system data in a nonvolatile manner.

The system data stored in an SSD controller may be rewritten whenever the write amount of user data in the SSD (e.g., NAND flash memory) increases. In an initial state of the NAND flash memory in which no data is written or the write amount is small, the system data may include a large amount of regularly aligned data such as 0x00 or 0xFF (hereinafter, referred to as "regular data" or "specific value"). In a state of the NAND flash memory in which the write amount is large, the system data includes a large amount of irregularly aligned data (hereinafter, referred to as "irregular data").

In a case where the regular data is compressed, the compression ratio is relatively high, and in a case where the irregular data is compressed, the compression ratio is relatively low. Therefore, in the initial state in which the write amount of user data is small, the compression ratio of the system data is relatively high. Thus, by compressing the system data, a period of time required for the nonvolatilization can be effectively reduced. However, in the state where the write amount of user data is large, the compression ratio of the system data is relatively low. Thus, even in a case where the system data is compressed, the system data cannot be compressed into a small size, and a period of time required for the nonvolatilization may rather increase considering a period of time required for the compression.

In the first embodiment, in a case where the total write amount of user data in the NAND flash memory 11 is less than a threshold, the system data is compressed, and the compressed system data is written into the NAND flash memory 11. In a case where the total write amount of user data meets or exceeds the threshold, the system data is written into the NAND flash memory 11 without compressed.

Figure 3:
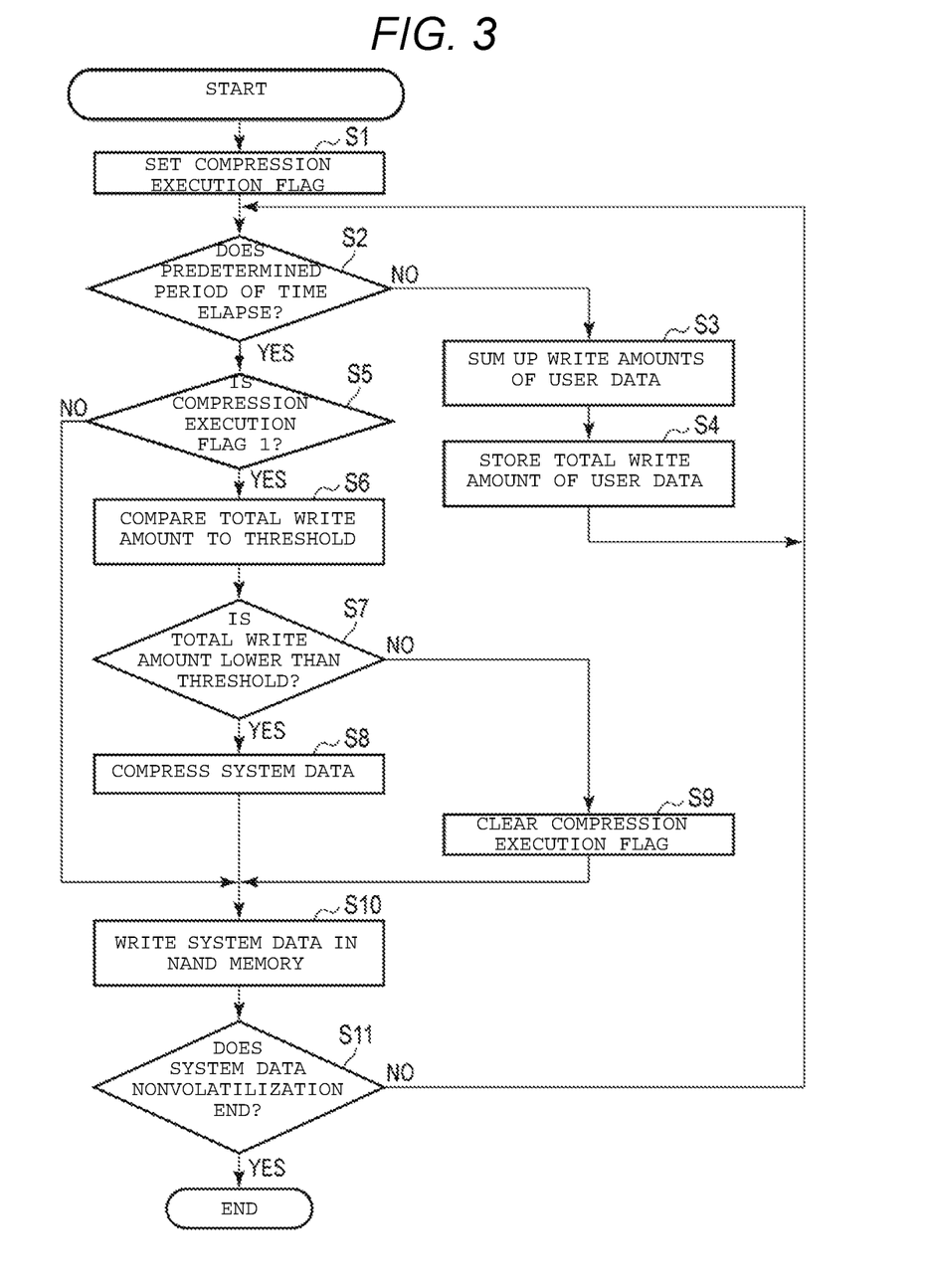
FIG. 3 is a flowchart illustrating a system data nonvolatilization in the SSD controller according to the first embodiment.

Hereinafter, the system data nonvolatilization of the SSD controller 20 according to the first embodiment will be described with reference to FIG. 3. FIG. 3 is a flowchart illustrating the system data nonvolatilization of the SSD controller. The nonvolatilization is executed by the CPU 21 in the SSD controller 20, and the same can be applied to nonvolatilization according to other embodiments described below.

When the system data nonvolatilization starts, first, the CPU 21 may set a compression execution flag to "1" (Step S1).

In the system data nonvolatilization, the system data may be written into the NAND flash memory 11 per predetermined period of time or when an instruction is given from the CPU 21. The CPU 21 may determine whether or not a predetermined period of time elapses from the start of the nonvolatilization or from the previous writing of the system data into the NAND flash memory 11 (Step S2). In a case where the predetermined period of time does not elapse (NO), the CPU 21 may sum up the write amounts of user data to calculate the total write amount of user data (Step S3). Next, the CPU 21 may store the total write amount of user data in, for example, the SRAM 22 (Step S4).

In a case where the predetermined period of time elapses in Step S2 (YES), the CPU 21 (or the data compression determination unit 211) may determine whether or not the compression execution flag is "1" (Step S5). In a case where the compression execution flag is "1" (YES), the CPU 21 (or the data compression determination unit 211) may compare the total write amount to a threshold (Step S6) and determine whether or not the total write amount is less than the threshold (Step S7).

In a case where the total write amount is less than the threshold in Step S7 (YES), the CPU 21 (or the data compression unit 213) may compress the system data (Step S8) and the flow proceeds to Step S10. On the other hand, in a case where the total write amount is not less than the threshold in Step S7 (NO), the CPU 21 may clear the compression execution flag to "0" (Step S9) and the flow proceeds to Step S10. In addition, in a case where the compression execution flag is not "1" in Step S5, the flow may proceed to Step S10.

Here, in a case where the system data is compressed, a period of time required to write the system data into the NAND flash memory 11 (hereinafter, referred to as "compression write time") can be obtained by adding up a period of time required to compress the system data and a period of time required to write the compressed system data into the NAND flash memory 11. On the other hand, in a case where the system data is not compressed, only a period of time to write the non-compressed system data (hereinafter, referred to as "non-compression write time") is required. The threshold may be set as a total write amount at which the compression write time and the non-compression write time are substantially the same. When the total write amount is less than the threshold, the compression write time is shorter than the non-compression write time. When the total write amount meets or exceeds the threshold, the compression write time is equal to or longer than the non-compression write time. The threshold may be set by actually measuring the compression write time and the non-compression write time with respect to the total write amount, or may be set by calculation based on simulation or the like.

Next, in Step S10, the CPU 21 (or the NAND write control unit 214) may write the compressed system data or the non-compressed system data into the NAND flash memory 11.

Next, the CPU 21 may determine whether or not the system data nonvolatilization ends (Step S11). In a case where the system data nonvolatilization does not end (NO), the flow may return to Step S2 and repeat the processes after Step S2.

In a case where the system data nonvolatilization ends in Step S11 (YES), the process may end.

Effect of First Embodiment

According to the first embodiment, a memory system capable of reducing write time can be provided.

Hereinafter, the effect of the first embodiment will be described in detail. In the first embodiment, whether or not the system data for managing the NAND flash memory 11 is to be compressed is selected based on the total write amount of user data, and the compressed system data or the non-compressed system data is stored into the NAND flash memory 11.

In a case where the total write amount of user data is less than the threshold, the system data is compressed, and the compressed system data is written into the NAND flash memory 11. In this case, the compression ratio of the system data is relatively high. Therefore, the period of time (compression write time), which can be obtained by adding up the period of time required to compress the system data and the period of time to write the compressed system data, is shorter than the period of time (non-compression write time) required to write the non-compressed system data. Therefore, when the system data is compressed and the compressed system data is written, the period of time required to store the system data in the NAND flash memory 11 can be reduced, as compared to a case where the system data is written without compressed.

In a case where the total write amount of user data meets or exceeds the threshold, the non-compressed system data is written into the NAND flash memory 11 without compressed. In this case, the compression ratio of the system data is relatively low. Therefore, the period of time, which is obtained by adding up the period of time required to compress the system data and the period of time to write the compressed system data, is equal to or longer than the period of time required to write the non-compressed system data. Therefore, when the system data is written without compressed, the period of time required to store the system data into the NAND flash memory 11 can be reduced, as compared to a case where the system data is compressed and the compressed system data is written.

As a result, both in a case where the total write amount of user data is less than the threshold, and in a case where the total write amount of user data meets or exceeds the threshold, the write time of the system data can be reduced.

In addition, in the first embodiment, in a case where the system data is compressed and the compressed system data is written into the NAND flash memory 11, the write amount (i.e., amount of data to be written) of the system data can be reduced. Therefore, a write amplification factor (WAF), which is a ratio of the amount of data that has to be actually written into the NAND flash memory 11 to the amount of user data that is requested to be written from the host device 200, can be reduced.

Next, a memory system according to a second embodiment will be described. In the second embodiment and modification examples, whether or not the system data is to be compressed is determined based on information regarding the system data.

In the second embodiment, whether or not the system data is to be compressed is determined based on the compression ratio of the system data. The compression ratio of the system data is a ratio of the size of the system data after the compression to the size of the system data before the compression.

Configurations of the memory systems according to the second embodiment and the modification examples may be the same as those of the first embodiment. In the second embodiment and the modification examples, different points from the first embodiment will be mainly described.

Operation of Second Embodiment

Figure 4:
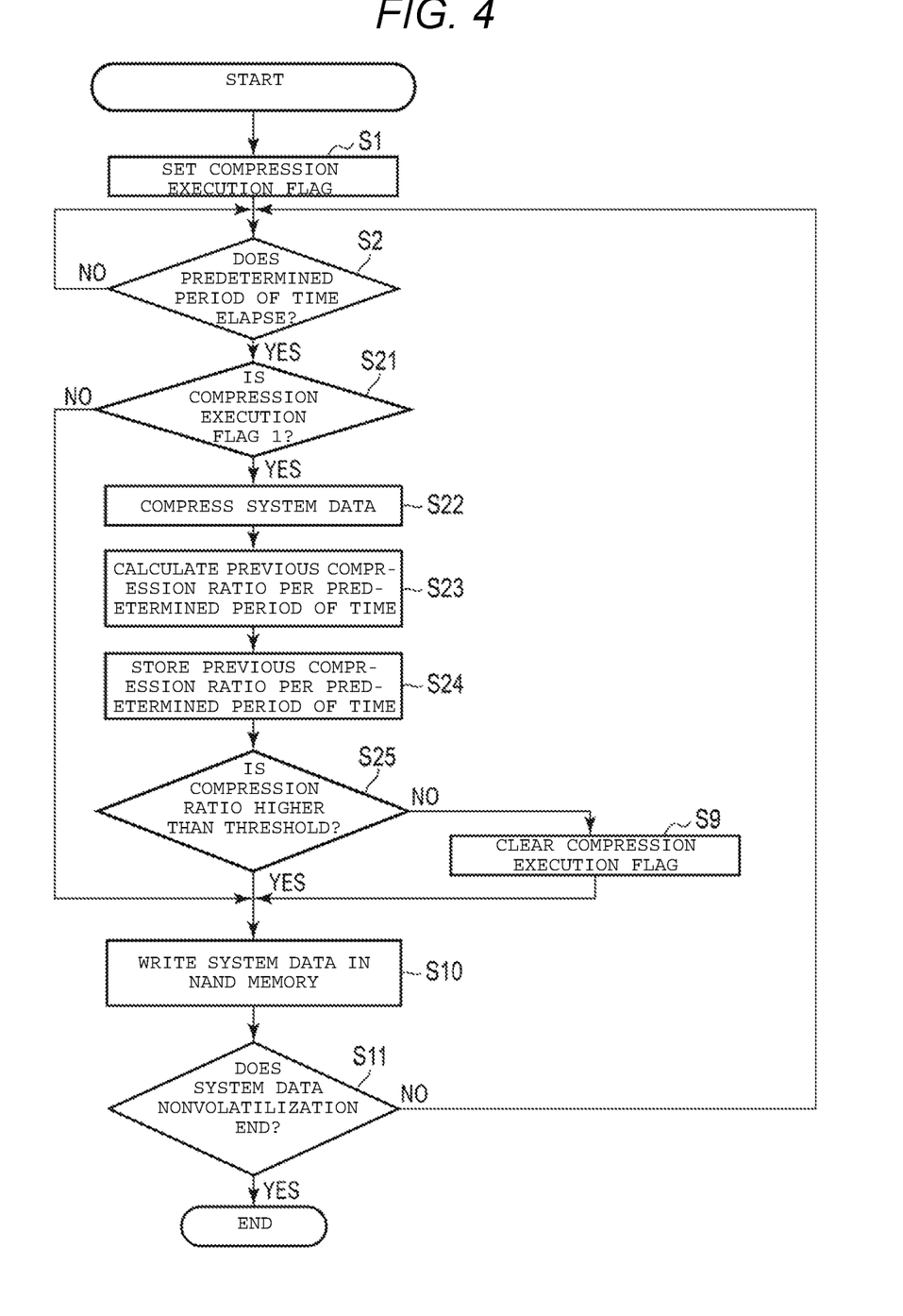
FIG. 4 is a flowchart illustrating a system data nonvolatilization in an SSD controller according to a second embodiment.

An operation of the memory system 100 according to the second embodiment will be described with reference to FIG. 4. FIG. 4 is a flowchart illustrating a system data nonvolatilization in the SSD controller 20 according to the second embodiment.

When the system data nonvolatilization starts, first, the CPU 21 may set a compression execution flag to "1" (Step S1). The CPU 21 may determine whether or not a predetermined period of time elapses from the start of the nonvolatilization or from the previous writing of the system data into the NAND flash memory 11 (Step S2). In a case where the predetermined period of time does not elapse (NO), the CPU 21 may repeat the process of Step S2 until the predetermined period of time elapses.

In a case where the predetermined period of time elapses in Step S2 (YES), the CPU 21 (or the data compression determination unit 211) may determine whether or not the compression execution flag is "1" (Step S21). In a case where the compression execution flag is "1" (YES), the CPU 21 (or the data compression unit 213) may compress the system data (Step S22).

Next, the CPU 21 may calculate a previous compression ratio of the system data per predetermined period of time (Step S23). Further, the CPU 21 may store the previous compression ratio of the system data in, for example, the SRAM 22 (Step S24). In some embodiments, the previous compression ratio per predetermined period of time may be the average value of compression ratio calculated during a given period of time. In some embodiments, the previous compression ratio per predetermined period of time may be a median value between a minimum value and a maximum value of compression ratio calculated during a given period of time.

Next, the CPU 21 (or the data compression determination unit 211) may determine whether or not the compression ratio of the system data is higher than a threshold (Step S25). In a case where the compression ratio is higher than the threshold (YES), the flow may proceed to Step S10 without the compression execution flag being cleared. On the other hand, in a case where the compression ratio is not higher than the threshold (NO), the CPU 21 may clear the compression execution flag (Step S9) and the flow proceeds to Step S10. In addition, in a case where the compression execution flag is not "1" in Step S21 (NO), the CPU 21 may proceed to Step S10.

Here, the threshold may be set as a compression ratio at which the compression write time and the non-compression write time are substantially the same. When the compression ratio is higher than the threshold, the compression write time is shorter than the non-compression write time. When the compression ratio is equal to or less than the threshold, the compression write time is equal to or longer than the non-compression write time. The threshold may be set by actually measuring the compression write time and the non-compression write time with respect to the compression ratio, or may be set by calculation based on simulation or the like.

Next, in Step S10, the CPU 21 (or the NAND write control unit 214) may write the compressed system data or the non-compressed system data into the NAND flash memory 11.

Next, the CPU 21 may determine whether or not the system data nonvolatilization ends (Step S11). In a case where the system data nonvolatilization does not end (NO), the flow may return to Step S2 and repeat the processes after Step S2.

In addition, in a case where the system data nonvolatilization ends in Step S11 (YES), the process may end.

Operation of First Modification Example

Next, an operation of a memory system according to the first modification example will be described. In the first modification example, whether or not the system data is to be compressed is determined based on a ratio of specific values in the system data.

Figure 5:
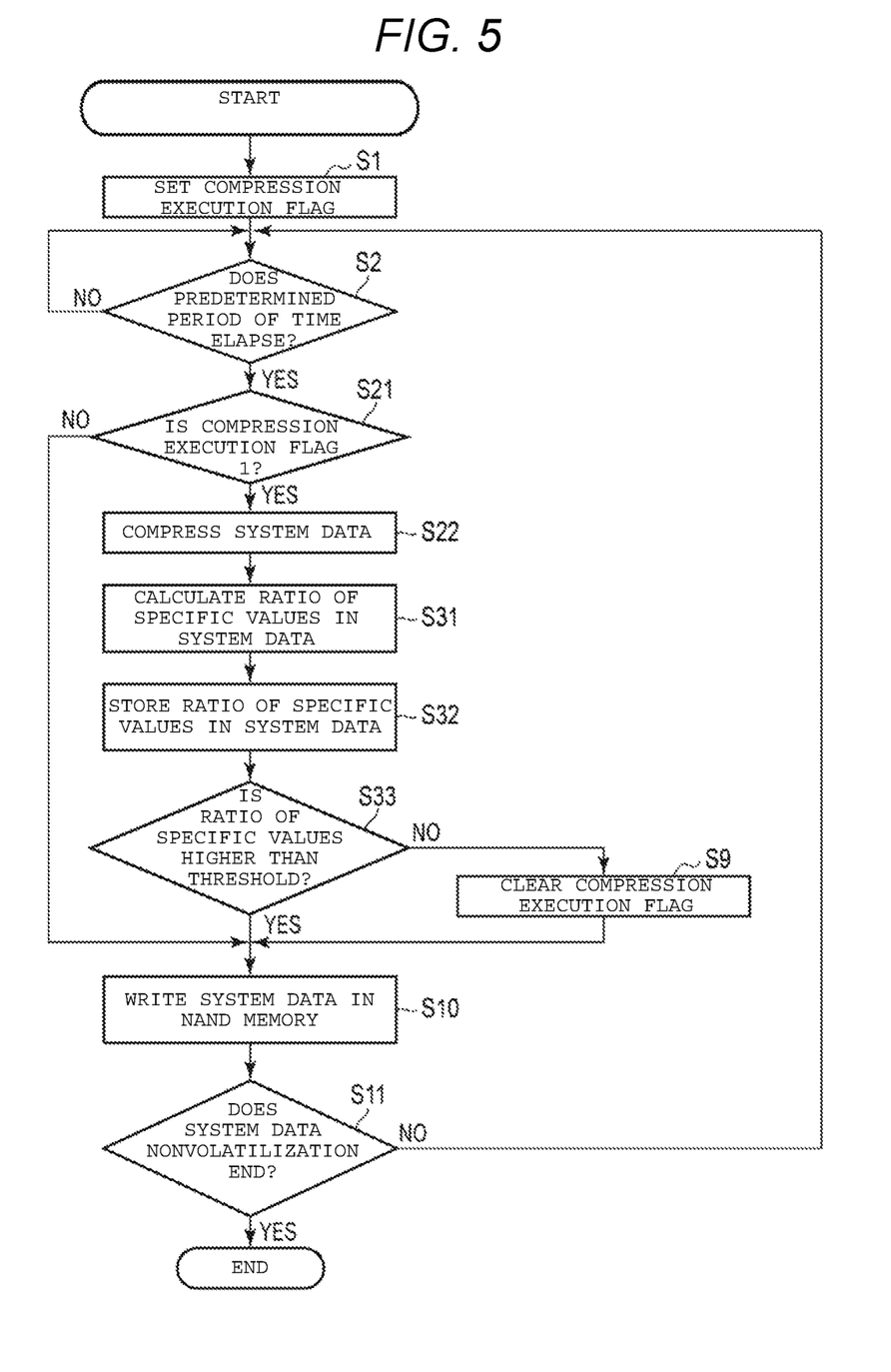
FIG. 5 is a flowchart illustrating a system data nonvolatilization in an SSD controller according to a first modification example.

FIG. 5 is a flowchart illustrating a system data nonvolatilization in the SSD controller 20 according to the first modification example.

When the system data nonvolatilization starts, first, the CPU 21 may set a compression execution flag to "1" (Step S1). The CPU 21 may determine whether or not a predetermined period of time elapses from the start of the nonvolatilization or from the previous writing of the system data into the NAND flash memory 11 (Step S2). In a case where the predetermined period of time does not elapse (NO), the CPU 21 may repeat the process of Step S2 until the predetermined period of time elapses.

In a case where the predetermined period of time elapses in Step S2 (YES), the CPU 21 (or the data compression determination unit 211) may determine whether or not the compression execution flag is "1" (Step S21). In a case where the compression execution flag is "1" (YES), the CPU 21 (or the data compression unit 213) may compress the system data (Step S22).

Next, the CPU 21 may calculate a ratio of specific values in the system data (Step S31). Further, the CPU 21 may store the calculated ratio of specific values in, for example, the SRAM 22 (Step S32). In the system data before the write amount of user data increases, a large number of specific values such as 0x00 or 0xFF are present. Here, 0x00 and 0xFF represent 00 and FF in hexadecimal notation, respectively. In a case where these specific values are compressed, the compression ratio is high. However, as the write amount of user data increases, the number of specific values such as 0x00 or 0xFF decreases. Therefore, the ratio of specific values in the system data, that is, the ratio of specific values to all the values in the system data may be used to determine whether or not the system data is to be compressed.

Next, the CPU 21 may determine whether or not the ratio of specific values in the system data is higher than a threshold (Step S33). In a case where the ratio of specific values is higher than the threshold (YES), the compression ratio of the system data is high (i.e., the compression is effective). Therefore, the flow may proceed to Step S10 without the compression execution flag being cleared. On the other hand, in a case where the ratio of specific values is not higher than the threshold (NO), the compression ratio of the system data is low (i.e., the compression is not effective). Therefore, the CPU 21 may clear the compression execution flag (Step S9) and the flow proceeds to Step S10. In addition, in a case where the compression execution flag is not "1" in Step S21 (NO), the flow may proceed to Step S10.

Here, the threshold may be set as a ratio of specific values at which the compression write time and the non-compression write time are substantially the same. When the ratio of specific values in the system data is higher than the threshold, the compression write time is shorter than the non-compression write time. When the ratio of specific values in the system data is the threshold or lower, the compression write time is equal to or longer than the non-compression write time. The threshold may be set by actually measuring the compression write time and the non-compression write time with respect to the ratio of specific values, or may be set by calculation based on simulation or the like.

Next, in Step S10, the CPU 21 (or the NAND write control unit 214) may write the compressed system data or the non-compressed system data into the NAND flash memory 11.

Next, the CPU 21 may determine whether or not the system data nonvolatilization ends (Step S11). In a case where the system data nonvolatilization does not end (NO), the flow may return to Step S2 and the processes after Step S2 are repeated.

In a case where the system data nonvolatilization ends in Step S11 (YES), the process may end.

Operation of Second Modification Example

Next, an operation of a memory system according to the second modification example will be described. In the second modification example, whether or not the system data is to be compressed is determined based on a slope (or a ratio) of a change in the compression ratio of the system data.

Figure 6:
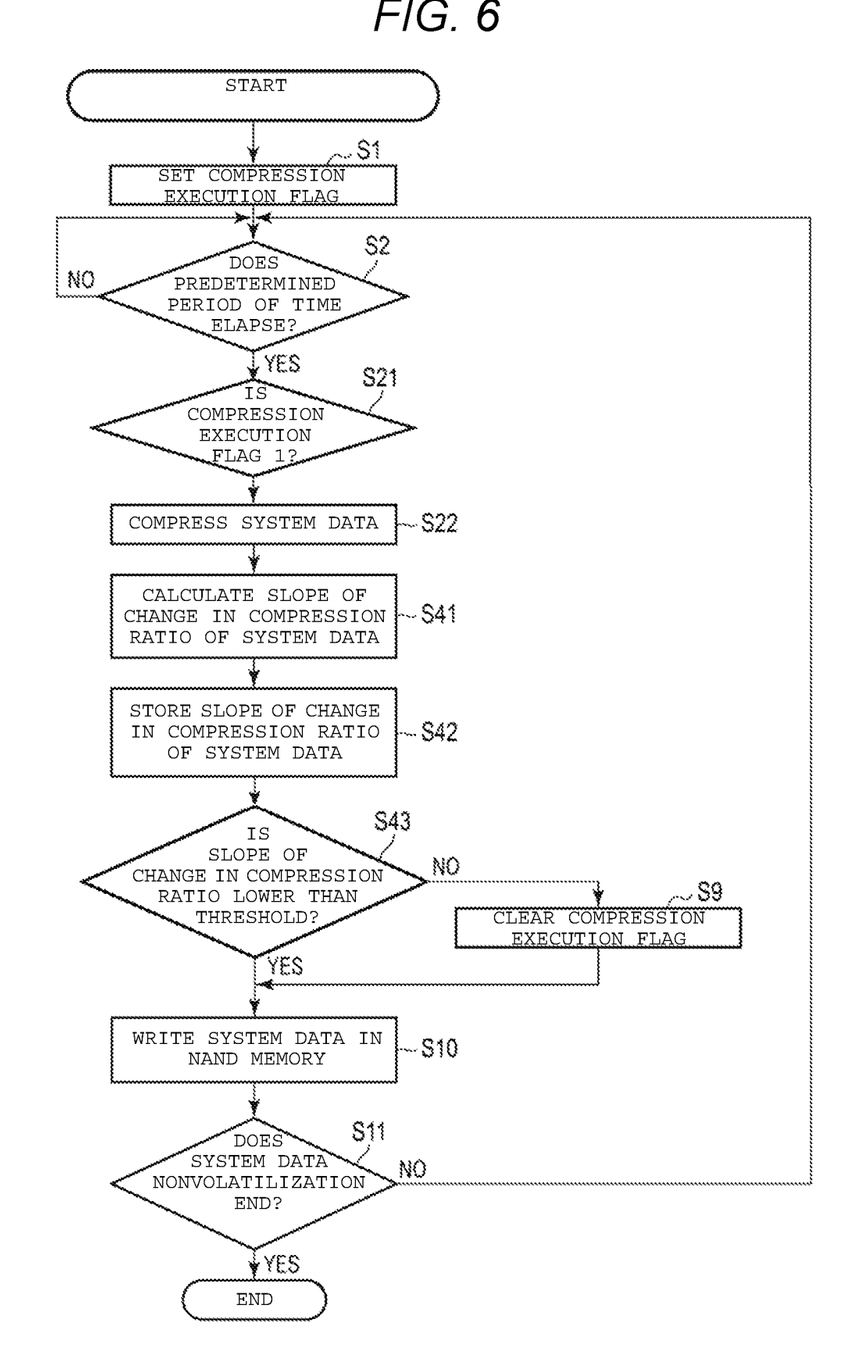
FIG. 6 is a flowchart illustrating a system data nonvolatilization in an SSD controller according to a second modification example.

FIG. 6 is a flowchart illustrating a system data nonvolatilization in the SSD controller 20 according to the second modification example.

When the system data nonvolatilization starts, first, the CPU 21 may set a compression execution flag to "1" (Step S1). The CPU 21 may determine whether or not a predetermined period of time elapses from the start of the nonvolatilization or from the previous writing of the system data into the NAND flash memory 11 (Step S2). In a case where the predetermined period of time does not elapse (NO), the process of Step S2 is repeated until the predetermined period of time elapses.

In a case where the predetermined period of time elapses in Step S2 (YES), the CPU 21 (or the data compression determination unit 211) may determine whether or not the compression execution flag is "1" (Step S21). In a case where the compression execution flag is "1" (YES), the CPU 21 (or the data compression unit 213) may compress the system data (Step S22).

Figure 7:
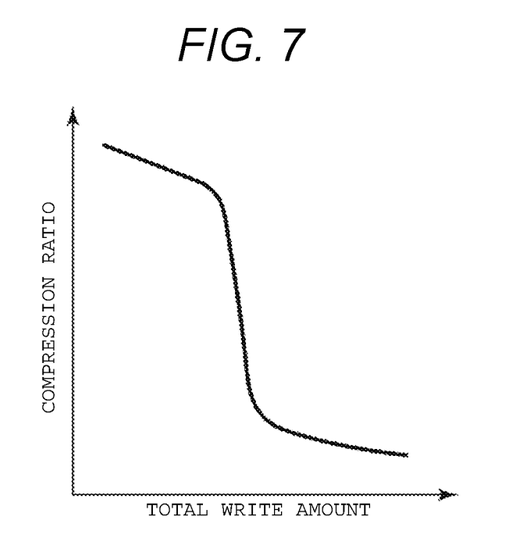
FIG. 7 is a diagram illustrating a change in a compression ratio of system data with respect to a total write amount of user data.

Next, the CPU 21 may calculate a slope (or a ratio) of a change in the compression ratio of the system data (Step S41). Further, the CPU 21 may store the calculated slope of the change in the compression ratio in, for example, the SRAM 22 (Step S42). As the write amount of user data increases, the slope of the change in the compression ratio of the system data rapidly changes at a certain point of time. FIG. 7 illustrates the change in the compression ratio of system data with respect to a total write amount of user data. As can be seen from FIG. 7, once the total write amount reaches a certain value, the compression ratio rapidly decreases. Therefore, a rapid decrease in the compression ratio can be recognized in advance using the slope of the change in the compression ratio of the system data.

Next, the CPU 21 may determine whether or not the slope of the change in the compression ratio of the system data is lower than a threshold (Step S43). When the slope of the change in the compression ratio is lower than the threshold (YES), the compression ratio of the system data does not rapidly decrease. Therefore, the flow may proceed to Step S10 without clearing the compression execution flag. On the other hand, when the slope of the change in the compression ratio is not lower than the threshold (NO), a rapid decrease in the compression ratio of the system data is expected. Therefore, the CPU 21 may clear the compression execution flag (Step S9) and the flow proceeds to Step S10. In addition, in a case where the compression execution flag is not "1" in Step S21 (NO), the flow may proceed to Step S10.

Here, the threshold may be set as a slope of a change in the compression ratio at which the compression write time and the non-compression write time are substantially the same. When the slope of the change in the compression ratio of the system data is lower than the threshold, the compression write time is shorter than the non-compression write time. When the slope of the change in the compression ratio of the system data is the threshold or higher, the compression write time is equal to or longer than the non-compression write time. The threshold may be set by actually measuring the compression write time and the non-compression write time with respect to the slope of the change in the compression ratio, or may be set by calculation based on simulation or the like.

Next, in Step S10, the CPU 21 (or the NAND write control unit 214) may write the compressed system data or the non-compressed system data into the NAND flash memory 11.

Next, the CPU 21 may determine whether or not the system data nonvolatilization ends (Step S11). In a case where the system data nonvolatilization does not end (NO), the flow may return to Step S2 and the processes after Step S2 are repeated.

In addition, in a case where the system data nonvolatilization ends in Step S11 (YES), the process may end.

Effect of Second Embodiment and Modification Examples

According to the second embodiment and the modification examples, a memory system capable of reducing write time can be provided.

In the second embodiment, whether or not the system data is to be compressed may be selected based on the compression ratio of the system data, and the compressed system data or the non-compressed system data may be stored into the NAND flash memory 11. In a case where the system data is compressed, a period of time required to store the system data into the NAND flash memory 11 (compression write time) is obtained by adding up a period of time required to compress the system data and a period of time required to write the compressed system data into the NAND flash memory 11. On the other hand, in a case where the system data is not compressed, only a period of time required to write the non-compressed system data (non-compression write time) is required.

In a case where the compression ratio of the system data is higher than a threshold, the system data is compressed, and the compressed system data is written into the NAND flash memory 11. In this case, the compression ratio of the system data is relatively high. Therefore, the period of time, which is obtained by adding up the period of time required to compress the system data and the period of time to write the compressed system data, is shorter than the period of time required to write the non-compressed system data. Therefore, when the system data is compressed and the compressed system data is written, the period of time required to store the system data into the NAND flash memory 11 can be reduced, as compared to a case where the system data is written without compressed.

In a case where the compression ratio of the system data is the threshold or lower, the non-compressed system data is written into the NAND flash memory 11 without compressed. In this case, the compression ratio of the system data is relatively low. Therefore, the period of time, which is obtained by adding up the period of time required to compress the system data and the period of time to write the compressed system data, is equal to or longer than the period of time required to write the non-compressed system data. Therefore, when the system data is written without compressed, the period of time required to store the system data into the NAND flash memory 11 can be reduced, as compared to a case where the system data is compressed and the compressed system data is written.

In the first modification example, whether or not the system data is to be compressed is selected based on the ratio of specific values in the system data (e.g., the ratio of values of 0x00 or 0xFF to all values in the system data).

In a case where the ratio of specific values in the system data is higher than a threshold, the system data is compressed, and the compressed system data is written into the NAND flash memory 11. In this case, since the compression ratio of the system data is relatively high, the compression write time is shorter than the non-compression write time. Therefore, when the system data is compressed and the compressed system data is written, the period of time required to store the system data into the NAND flash memory 11 can be reduced, as compared to a case where the system data is written without compressed.

In a case where the ratio of specific values in the system data is the threshold or lower, the non-compressed system data is written into the NAND flash memory 11 without compressed. In this case, since the compression ratio of the system data is relatively low, the compression write time is equal to or longer than the non-compression write time. Therefore, when the system data is written without compressed, the period of time required to store the system data into the NAND flash memory 11 can be reduced, as compared to a case where the system data is compressed and the compressed system data is written.

In the second modification example, whether or not the system data is to be compressed is selected based on the slope (or the ratio) of the change in the compression ratio of the system data.

In a case where the slope of the change in the compression ratio of the system data is lower than a threshold, the system data is compressed, and the compressed system data is written into the NAND flash memory 11. In this case, since the compression ratio of the system data is relatively high, the compression write time is shorter than the non-compression write time. Therefore, when the system data is compressed and the compressed system data is written, the period of time required to store the system data into the NAND flash memory 11 can be reduced, as compared to a case where the system data is written without compressed.

In a case where the slope of the change in the compression ratio of the system data is the threshold or higher, the non-compressed system data is written into the NAND flash memory 11 without compressed. In this case, since the compression ratio of the system data is relatively low, the compression write time is equal to or longer than the non-compression write time. Therefore, when the system data is written without compressed, the period of time required to store the system data into the NAND flash memory 11 can be reduced, as compared to a case where the system data is compressed and the compressed system data is written.

As a result, in the second embodiment and the modification examples, a period of time required to write the system data into the NAND flash memory 11 can be reduced.

In addition, in Steps S25, S33, and S43, the system data as a determination target for whether or not the system data is to be compressed may be all the data in the system data, or may be some data in the system data. In addition, the system data is written into the NAND flash memory 11 per predetermined period of time. In this case, per predetermined period of time, all the data in the system data may be determined, or only some data in the system data may be determined. Further, all the data in the system data may be determined once in several system data writes during a predetermined period of time, and some data in the system data may be determined the other times in the several data writes during the predetermined period of time. In addition, by recording the amount of data that is rewritten from an initial state of the system data in advance, the ratio of specific values, the compression ratio, or the like may be calculated based on a ratio of the amount of the rewritten data with respect to the initial state While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system comprising:
a nonvolatile memory; and
a controller configured to control the nonvolatile memory using first data,
wherein the controller is configured to write either the first data or second data into the nonvolatile memory based on a total write amount of user data into the nonvolatile memory, the second data being compressed data of the first data,
wherein when the total write amount of the user data is less than a first value, the controller is configured to write the second data into the nonvolatile memory,
when the total write amount of the user data is equal to or greater than the first value, the controller is configured to write the first data into the nonvolatile memory, and
wherein in a case where a first period of time and a second period of time are acquired, the first value is set as a value of the total write amount of the user data where the first period of time and the second period of time match each other, the first period of time being obtained by adding up a period of time required to compress the first data into the second data and a period of time required to write the second data into the nonvolatile memory, and the second period of time being a period of time required to write the first data into the nonvolatile memory.

2. The memory system according to claim 1,
wherein the first data is data that is updated in response to at least either reading or writing of user data from or into the nonvolatile memory rather than the user data itself.

3. The memory system according to claim 2,
wherein the first data includes an address conversion table for converting a logical address associated with the user data into a physical address indicating a storage location of the nonvolatile memory in which the user data is stored.

4. A memory system comprising:
a nonvolatile memory; and
a controller configured to control the nonvolatile memory using first data,
wherein the controller is configured to write either the first data or second data into the nonvolatile memory based on information regarding the first data, the second data being compressed data of the first data,
wherein the information is a compression ratio of the second data with respect to the first data,
when the compression ratio is higher than a first value, the controller is configured to write the second data into the nonvolatile memory,
when the compression ratio is equal to or less than the first value, the controller is configured to write the first data into the nonvolatile memory, and
wherein in a case where a first period of time and a second period of time are acquired, the first value is set as a value of the compression ratio of the second data with respect to the first data where the first period of time and the second period of time match each other, the first period of time being obtained by adding up a period of time required to compress the first data into the second data and a period of time required to write the second data into the nonvolatile memory, and the second period of time being a period of time required to write the first data into the nonvolatile memory.

5. The memory system according to claim 4,
wherein the first data is not user data but is data that is updated in response to at least either reading or writing of the user data from or into the nonvolatile memory.

6. The memory system according to claim 4,
wherein the first data includes an address conversion table for converting a logical address associated with user data into a physical address indicating a storage location of the nonvolatile memory into which the user data is stored.

7. The memory system according to claim 4,
wherein the information is a ratio of a change in a compression ratio of the second data with respect to the first data,
when the ratio of the change in the compression ratio is lower than a first value, the controller is configured to write the second data into the nonvolatile memory, and
when the ratio of the change in the compression ratio is the first value or higher, the controller is configured to write the first data into the nonvolatile memory.

8. The memory system according to claim 7,
wherein in a case where a first period of time and a second period of time are acquired, the first value is set as a value where the first period of time and the second period of time match each other, the first period of time being obtained by adding up a period of time required to compress the first data into the second data and a period of time required to write the second data into the nonvolatile memory, and the second period of time being a period of time required to write the first data into the nonvolatile memory.

9. The memory system according to claim 4,
wherein the information is a ratio of specific values included in the first data,
when the ratio of specific values is higher than a first value, the controller is configured to write the second data into the nonvolatile memory, and
when the ratio of specific values is equal to or less than the first value, the controller is configured to write the first data into the nonvolatile memory.

10. The memory system according to claim 9,
wherein in a case where a first period of time and a second period of time are acquired, the first value is set as a value of the ratio of specific values where the first period of time and the second period of time match each other, the first period of time being obtained by adding up a period of time required to compress the first data into the second data and a period of time required to write the second data into the nonvolatile memory, and the second period of time being a period of time required to write the first data into the nonvolatile memory.

11. The memory system according to claim 9,
wherein the ratio of specific values is a ratio of the amount of values of 0x00 and 0xFF to the amount of all values in the first data.

* * * * *